United States Patent
Zhang et al.

(10) Patent No.: US 9,959,050 B2
(45) Date of Patent: May 1, 2018

(54) IN-MEMORY DATA STORAGE WITH TRANSPARENT COMPRESSION

(71) Applicant: ScaleFlux, San Jose, CA (US)

(72) Inventors: Tong Zhang, Albany, NY (US); Hao Zhong, Los Gatos, CA (US); Fei Sun, Irvine, CA (US); Yang Liu, Milpitas, CA (US)

(73) Assignee: SCALEFLUX, San Jose, CA (US)

( * ) Notice: Subject to any disclaimer, the term of this patent is extended or adjusted under 35 U.S.C. 154(b) by 0 days. days.

(21) Appl. No.: 15/422,601

(22) Filed: Feb. 2, 2017

(65) Prior Publication Data

US 2017/0220262 A1     Aug. 3, 2017

Related U.S. Application Data

(60) Provisional application No. 62/290,905, filed on Feb. 3, 2016.

(51) Int. Cl.
| | |
|---|---|
| *G06F 11/00* | (2006.01) |
| *H03M 13/00* | (2006.01) |
| *G11C 29/00* | (2006.01) |
| *G06F 3/06* | (2006.01) |
| *G06F 11/10* | (2006.01) |
| *G06F 17/30* | (2006.01) |
| *H03M 13/35* | (2006.01) |
| *H03M 7/30* | (2006.01) |

(52) U.S. Cl.
CPC .......... *G06F 3/0608* (2013.01); *G06F 3/064* (2013.01); *G06F 3/0619* (2013.01); *G06F 3/0673* (2013.01); *G06F 11/1076* (2013.01); *G06F 17/30138* (2013.01); *H03M 7/60* (2013.01); *H03M 13/356* (2013.01); *H03M 13/6505* (2013.01)

(58) Field of Classification Search
CPC .... G06F 3/064; G06F 3/0673; G06F 11/1076; G06F 17/30138; G06F 11/1004; G06F 3/0644; H03M 7/60; H03M 13/356; H03M 13/6505
See application file for complete search history.

(56) References Cited

U.S. PATENT DOCUMENTS

| | | | |
|---|---|---|---|
| 2007/0005911 A1* | 1/2007 | Yang | G06F 12/023 711/154 |
| 2015/0242309 A1* | 8/2015 | Talagala | G06F 12/0246 711/103 |
| 2017/0242631 A1* | 8/2017 | Camp | H03M 13/6312 |

* cited by examiner

*Primary Examiner* — Christine T. Tu
(74) *Attorney, Agent, or Firm* — Hoffman Warnick LLC

(57) ABSTRACT

A storage aware memory controller and method for managing a physical storage system. A described controller includes: a system for mapping physical memory space into a memory region and a storage region; a system for applying different error protections schemes, in which a fine-grained memory fault tolerance scheme is applied to data in the memory region and a course-grained memory fault tolerance scheme is applied to data in the storage region; and an in-memory storage filesystem that compresses and stores individual pages of data in the storage region, wherein each page of data is compressed into a set of codewords that are codeword aligned such that no codeword shares compressed data from different pages, and wherein the in-memory storage filesystem stores a compression-aware logical block address (CA-LBA) for each page of data.

20 Claims, 5 Drawing Sheets

IN-MEMORY DATA STORAGE WITH TRANSPARENT COMPRESSION

PRIORITY CLAIM

This application claims priority to U.S. Provisional Patent Application Ser. No. 62/290,905 filed Feb. 3, 2016, which is hereby incorporated herein as though fully set forth.

TECHNICAL FIELD

The present invention relates to the field of computer memory, and particularly to improving cost effectiveness of implementing in-memory data storage in various computing systems.

BACKGROUND

Driven by the inevitable trend towards the cloud, more and more real-time in-memory computing applications are being served by large-scale parallel processing platforms (e.g., Hadoop). As a result, large-scale parallel processing platforms must employ distributed in-memory data storage systems to realize data sharing and exchange among different in-memory computation frameworks and jobs. Distributed in-memory data storage systems form a large-scale distributed cache layer sitting between in-memory computation frameworks/jobs and persistent storage systems (e.g., Amazon S3 and HDFS).

However, in-memory storage is fundamentally subject to two cost issues, and how well one can tackle these two cost issues largely affects the overall system performance of future large-scale parallel processing platforms: (1) Memory resource cost: It is apparent that in-memory data storage tends to occupy a large amount of memory capacity. This will become increasingly significant as more and more memory-centric data processing tasks are being migrated onto a single large-scale parallel processing platform. This directly results in memory resource confliction between the application layer and the underlying in-memory data storage layer. In spite of the continuous scaling of DRAM beyond the 20 nm node and the maturing new low-cost memory technologies (e.g., 3D XPoint), the ever-increasing demand for more memory capacity will keep memory as one of the most expensive resources. Hence, it is highly desirable to minimize the memory capacity (and hence cost) overhead induced by in-memory data storage systems. (2) Computation cost: Different from a traditional buffer pool mechanism, in-memory data storage systems hold the data in a storage-oriented format (e.g., JSON, Parquet, and ORC) other than as in-memory objects. Therefore, when moving data across the application layer and in-memory storage layer, data format conversion is required and can result in significant computation cost. In addition, as the most obvious option to reduce memory capacity overhead of in-memory data storage, data compression inevitably leads to further computation costs. This directly results in computation resource confliction between the application layer and the underlying in-memory data storage layer.

SUMMARY

Accordingly, embodiments of the present disclosure are directed to a system and process for reducing the memory resource costs in the realization of in-memory data storage systems. A disclosed device provides a storage-aware memory controller integrated circuit, which carries out operations to reduce memory resource cost for in-memory data storage systems in addition to carrying out normal memory control operations.

In a first aspect, the disclosure provides a storage aware memory controller for in-memory data processing, comprising: a system for mapping physical memory space into a memory region and a storage region; a system for applying different error protections schemes, in which a fine-grained memory fault tolerance scheme is applied to data in the memory region and a course-grained memory fault tolerance scheme is applied to data in the storage region; and an in-memory storage filesystem that compresses and stores individual pages of data in the storage region, wherein each page of data is compressed into a set of codewords that are codeword aligned such that no codeword shares compressed data from different pages, and wherein the in-memory storage filesystem stores a compression-aware logical block address (CA-LBA) for each page of data.

In a second aspect, the disclosure provides a memory system comprising: a physical memory; and a storage aware memory controller for in-memory data processing, wherein the storage aware memory controller includes: a system for mapping the physical memory into a memory region and a storage region; a system for applying different error protections schemes, in which a fine-grained memory fault tolerance scheme is applied to data in the memory region and a course-grained memory fault tolerance scheme is applied to data in the storage region; and an in-memory storage filesystem that causes individual pages of data to be compressed and stored in the storage region, wherein each page of data is compressed into a set of codewords that are codeword aligned, and wherein the in-memory storage filesystem stores a compression-aware logical block address (CA-LBA) for each page of data.

In a third aspect, the invention provides computer programming logic stored in a computer readable storage medium, which when executed by a processing core, provides storage aware memory control for in-memory data processing, and comprises: program logic for mapping physical memory space into a memory region and a storage region; program logic for applying different error protections schemes, in which a fine-grained memory fault tolerance scheme is applied to data in the memory region and a course-grained memory fault tolerance scheme is applied to data in the storage region; program logic that compresses and stores individual pages of data in the storage region, wherein each page of data is compressed into a set of codewords that are codeword aligned such that no codeword shares compressed data from different pages; and program code for maintaining a compression-aware logical block address (CA-LBA) for each page of data.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Figure 1:
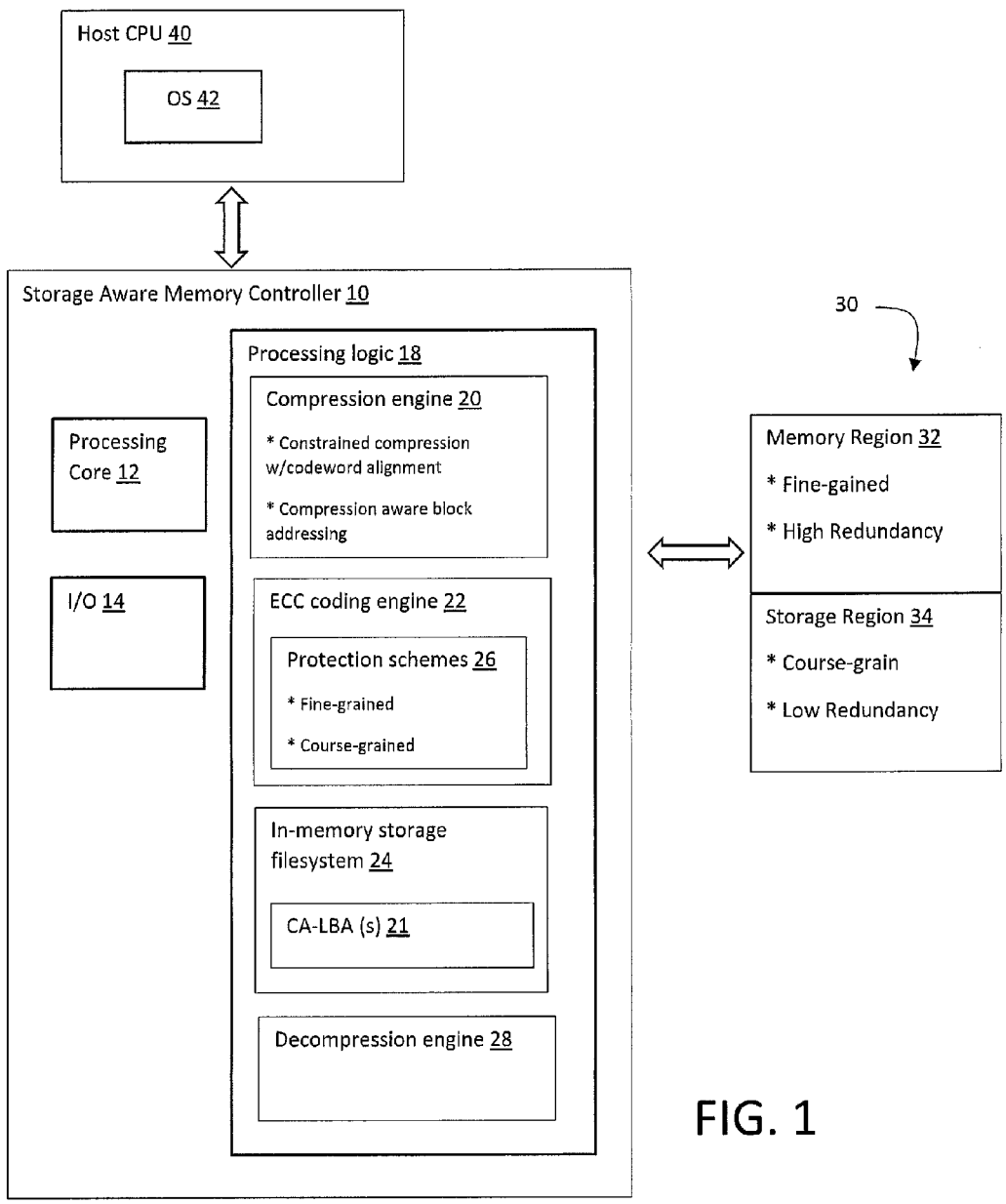
FIG. 1 illustrates the overall structure of the device according to embodiments.

As shown in FIG. 1, a storage aware memory controller 10 is provided that essentially resides between a host CPU (central processing unit) 40 and a physical memory or memory space 30 to provide advanced storage capabilities that the host CPU is generally unaware of. In addition to carrying out standard memory control operations between a host CPU 40 and memory space 30, the illustrative storage-aware memory controller 10 also provides a lossless data compression engine 20 and a versatile ECC coding engine 22. As detailed herein, these two components allow "less critical data" to be more efficiently stored and retrieved in the memory space 30. Namely, such data is stored utilizing filesystem transparent compression, in which the host CPU 40 is essentially unaware of the data compression.

Initially, an in-memory data storage filesystem 24 allocates a portion of the physical memory space 30 for in-memory data storage (e.g., for less critical data). As a result, the entire memory space 30 contains two regions: (1) memory region 32 that behaves as normal memory and has a relatively fine-grained access pattern (e.g., 8 bytes or 16 bytes), and (2) storage region 34 that is managed by the in-memory data storage filesystem 24 and has a relatively coarse-grained access pattern (e.g., 128 bytes to 4096 bytes) for less critical data. Any criteria for determining which data is allocated to which region may be utilized. It is also noted that the illustrative embodiments describe an in-memory storage scheme in which data is stored as 4096 byte (4 kB) pages, however, it is understood that the page size may vary, e.g., to align with an error protection scheme. Also, it is noted that described in-memory storage scheme is primarily applicable to immutable data, i.e., data that does not change.

In this illustrative embodiment, an error correction code (ECC) coding engine 22 protects the memory region 32 and storage region 34 using different protection schemes 26, i.e., different memory fault tolerance granularities and hence different redundancy overheads. Fine-grained memory fault tolerance protects memory devices with relatively small granularity (e.g., 8 bytes or 16 bytes), which typically comes with relatively high redundancy overhead. Coarse-grained memory fault tolerance protects memory devices with relatively large granularity (e.g., 128 bytes to 4096 bytes), which typically comes with relatively low redundancy overhead. In particular, if the memory fault tolerance is realized by ECC, the storage-aware memory controller 10 protects the memory region 32 using ECCs with relatively short codeword lengths and hence relatively high coding redundancy, and protects the storage region 34 using ECCs with relatively long codeword lengths and hence relatively low coding redundancy.

To allocate physical memory space for the in-memory storage, the in-memory storage filesystem 24 requests a certain number (e.g., $n_p$) of physical memory pages from the OS 42 in host CPU 40 as needed, so that these memory pages can store a predetermined number (e.g., $n_b$) of blocks in the storage region 34. Accordingly, each group of $n_b$ blocks forms a virtual block in the in-memory storage region 34, which is managed by the in-memory storage filesystem 34.

In spite of its simple concept, filesystem transparent compression has not been widely used in practice mainly because of the associated latency overhead. In filesystems that provide transparent compression (e.g., ZFS, Btrfs, and NTFS), data compression is typically performed on a large unit of a fixed-size data chunk (e.g., 64 kB or 128 kB), and access to any 4 kB page requires reading and decompressing the entire chunk. Therefore, the latency overhead induced by transparent compression comes from two aspects: (1) access to any 4 kB page triggers the read of multiple 4 kB blocks, leading to read amplification and hence read latency overhead; and (2) data decompression consumes CPU cycles and extra CPU-memory data traffic, leading to additional read latency overhead. In addition, filesystem metadata management becomes more complicated. In particular, filesystems must keep tracking the location and size of each compressed data chunk, and carry out additional metadata look-up when serving read requests. Moreover, although data compression latency is not as critical as decompression latency, compression tends to be more computation-intensive (in particular when concatenating LZ-type dictionary compression with entropy coding like GZip).

The present approach presents a cross-layer hardware/software design solution to eliminate the latency overhead and compression-induced CPU stress when applying transparent compression to immutable files being stored in the in-memory data storage. In particular, this approach achieves the following two objectives: (1) zero read amplification: whenever an application requests a read of any page (e.g., 4 kB), the storage aware memory controller 10 reads no more than 4 kB data physically from the memory space 30; and (2) zero compression/decompression workload on CPU: data compression/decompression is done at the controller 10 so as not to consume any extra CPU cycles and/or extra CPU-memory data traffic.

To realize zero-read-amplification transparent compression, the compression engine 20 utilizes two concepts, (1) constrained compression with codeword alignment; and (2) compression-aware block addressing.

As noted, the storage-aware memory controller 10 employs coarse-grained ECC to protect data in the storage region 34. In addition, the in-memory storage filesystem 24 allocates in-memory storage space in the storage region 34 as virtual blocks for storing a set of pages, in this case 4 kB for each page. To realize transparent compression, the compression engine 20 compresses each 4 kB page into a set of blocks or ECC codewords and enforces/ensures that each compressed 4 kB page does not share ECC codewords with other compressed pages, i.e., each ECC codeword only contains data belonging to an associated compressed 4 kB page.

Figure 2:
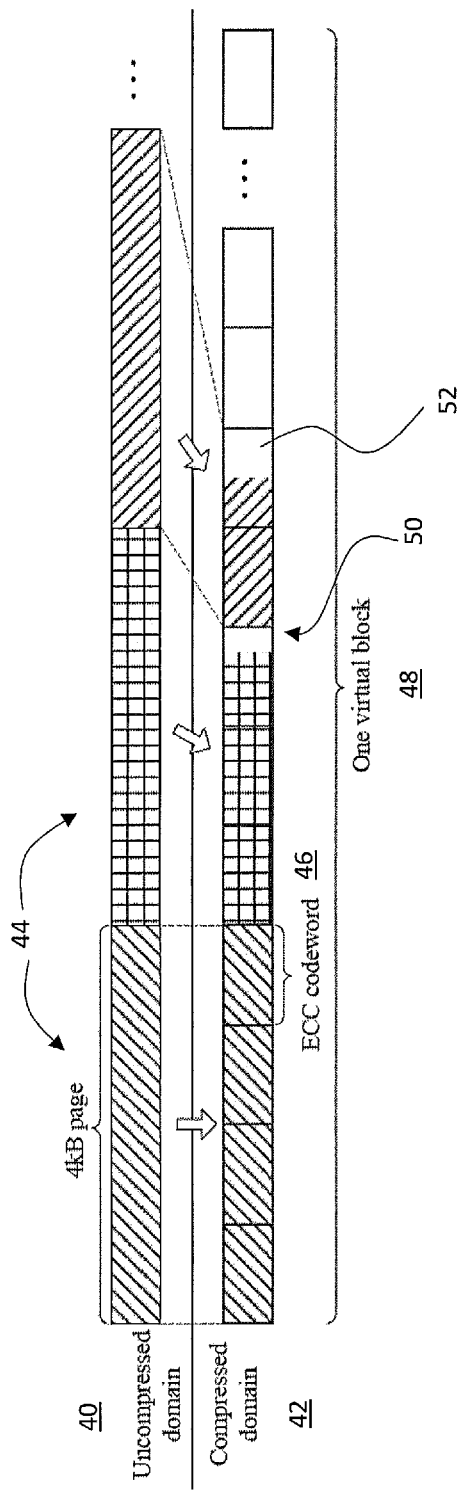
FIG. 2 illustrates the constrained compression with codeword alignment according to embodiments.

FIG. 2 illustrates the concept of constrained compression with codeword alignment. The top half of the figure depicts data in the uncompressed domain 40 (i.e., prior to storage in the storage region 34) and the bottom half depicts data in the compressed domain 42 (i.e., after storage). In the uncompressed domain 40, data is broken up into 4 kB pages 44 for compression. Each 4 kB page is compressed into a set of ECC codewords 46, with a superset of the ECC codewords forming a virtual block 48. Each compressed 4 kB page 44 is aligned at the beginning 50 of a next fully available ECC codeword. Thus, the last ECC codeword of a compressed page will typically contain some empty space 52. This allows any set of compressed ECC codewords (corresponding to an associated 4 kB page 44) to be more readily accessed in the compressed domain 42.

Figure 3:
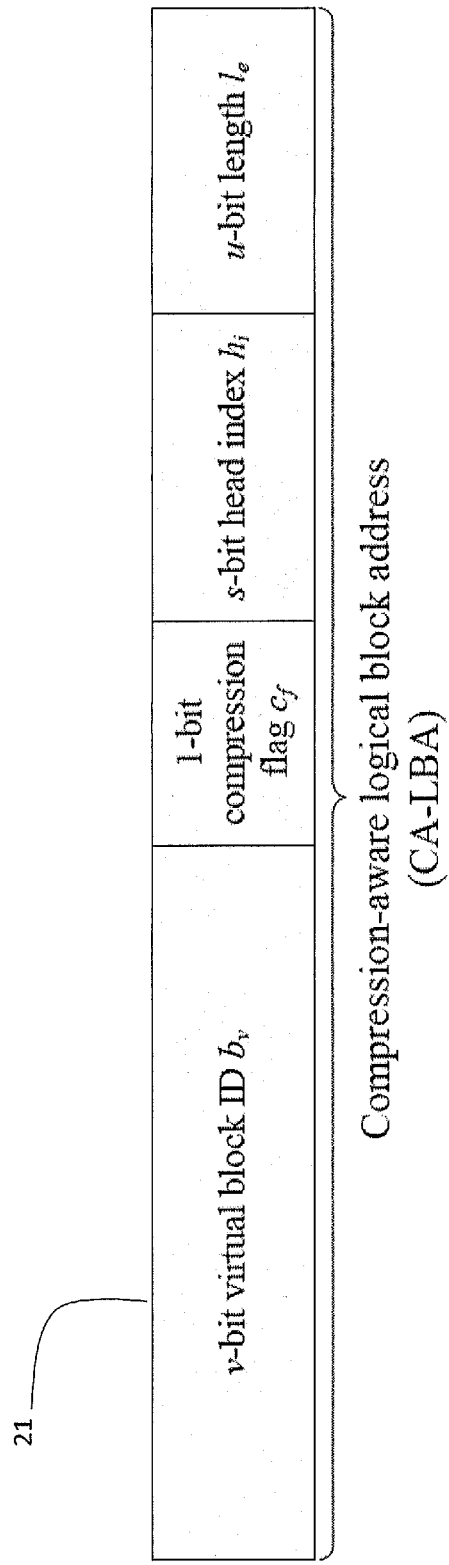
FIG. 3 illustrates the compression-aware block addressing according to embodiments.

The second concept, compression-aware block addressing is implemented as follows, which simplifies the metadata structure for the in-memory storage filesystem 24. For each individual 4 kB logical block 44 visible to upper-level applications, the in-memory storage filesystem 24 maintains a compression-aware logical block address (CA-LBA) 21. Each CA-LBA 21 is utilized by the in-memory storage file system 24 to quickly access compressed blocks from storage. An illustrative CA-LBA 21 is shown in FIG. 3.

For example, assume the storage region 34 can contain up to $n_v$ virtual blocks, one virtual block consists of total $n_s$ ECC codewords, and one uncompressed 4 kB page can be protected by $n_u$ ECC codewords. Each CA-LBA may for example contain four parts: (i) v-bit virtual block ID $b_v$, where $v=\lceil \log_2 n_v \rceil$, (ii) 1-bit compression flag $c_f$ (i.e., which allows for the disabling of compression, e.g., for any incompressible 4 kB pages), (iii) s-bit head index $h_i$ (i.e., the storage of the compressed 4 kB page starts from the $h_i$-th ECC codeword in the current virtual block), where $s=\lceil \log_2 n_s \rceil$, and (iv) u-bit length $l_e$ that represents the number of additional ECC codewords being used (i.e., total $l_e+1$ ECC codewords are used to store the compressed 4 kB page), where $u=\lceil \log_2 n_u \rceil$.

Figure 4:
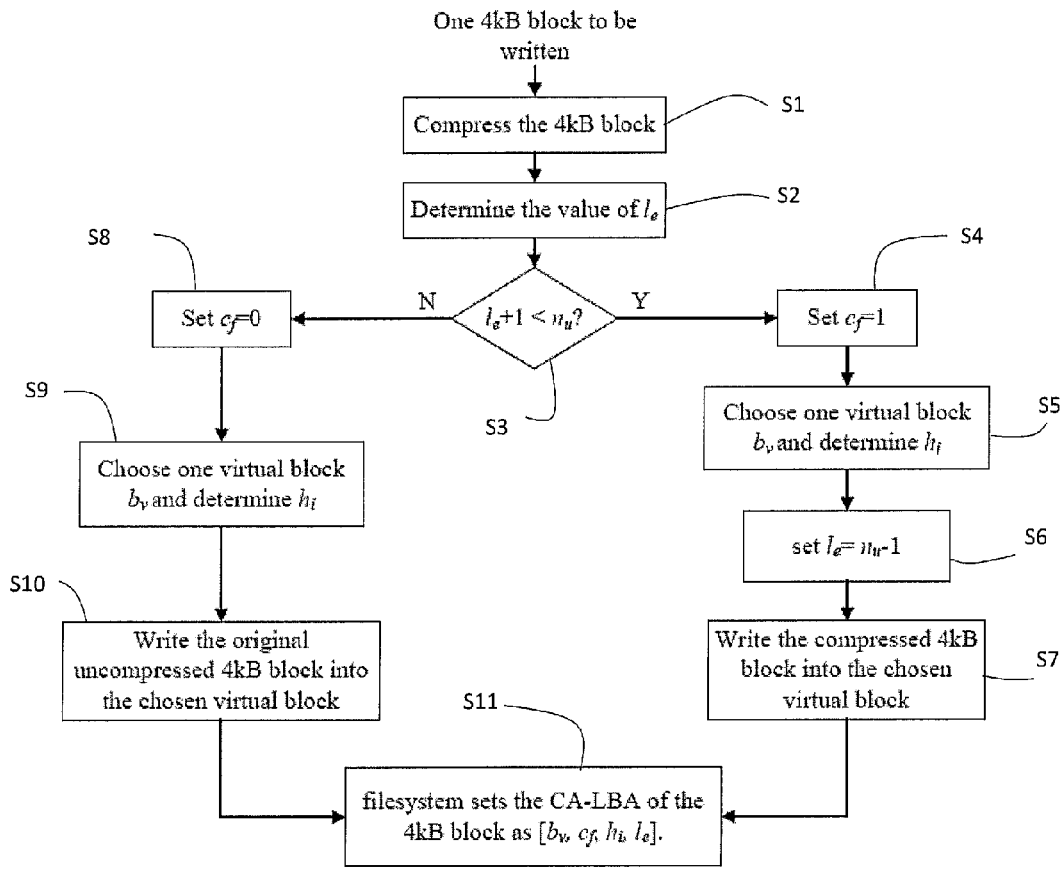
FIG. 4 illustrates the data write flow diagram according to embodiments.

FIG. 4 shows the write flow diagram for storing compressed data in the storage region 34. Upon receiving a 4 kB block to be written into the in-memory data storage, the in-memory storage filesystem 24 first compresses the 4 kB block at S1. The compression can be done using the lossless compression engine 20 integrated in the storage-aware memory controller 10. Next at S2, the value of $l_e$, which represents a number of codewords, is determined. More particularly, $l_e$ indicates that the compressed 4 kB page requires $l_e+1$ ECC codewords. Next, a determination is made at S3 whether to store the 4 kB page in a compressed or uncompressed format. In particular:

If $l_e+1 < n_u$, then set the 1-bit compression flag $c_f$ as 1 at S4, at S5 search for one virtual block $b_v$ that has at least $l_e+1$ ECC codewords of space available beginning at $h_i$, set $l_e = n_u - 1$ at S6, and store the compressed 4 kB block into the chosen virtual block at S7.

If $l_e+1 \geq n_u$, then set the 1-bit compression flag $c_f$ as 0 at S8, and search for one virtual block that has at least $n_u$ ECC codewords space available, and store the original uncompressed 4 kB block into the chosen virtual block.

In both cases, $b_v$ denotes the ID of the chosen virtual block, and denotes the position of the first available ECC codeword in the chosen virtual block. The in-memory storage filesystem 24 then stores parameter values $[b_v, c_f, h_i, l_e]$ for CA-LBA 21 of the 4 kB block at S11.

Figure 5:
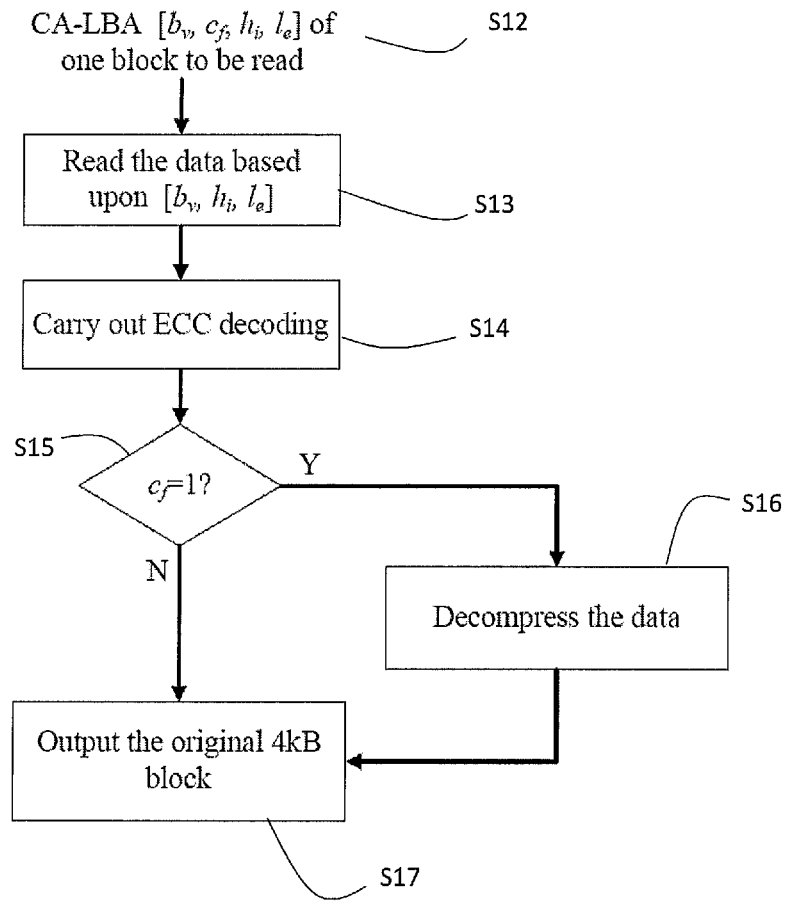
FIG. 5 illustrates the data read flow diagram according to embodiments.

FIG. 5 shows the read flow diagram for reading data from the storage region 34. To read a 4 kB page, the in-memory storage filesystem 24 first fetches the corresponding CA-LBA 11 $[b_v, c_f, h_i, l_e]$ at S12. Based upon the values of $b_v$, $h_i$, and $l_e$, the in-memory storage filesystem 24 reads the $l_e+1$ ECC codewords from the identified virtual block at S13, and carries out the ECC decoding at S14. If $c_f=1$ at S15 (indicating that the page was compressed), the in-memory storage filesystem 24 carries out data decompression at S16 to obtain and output the original 4 kB page, otherwise, the in-memory storage filesystem 24 directly outputs the 4 kB page AT S17. The decompression can be done using a lossless compression engine 28 integrated in the storage-aware memory controller 10.

It is understood that the storage aware memory controller 10 may be implemented in any manner, e.g., as an integrated circuit board that includes a processing core 12, I/O 14 and processing logic 18. Processing logic 18 may be implemented in hardware/software, or a combination thereof. For example, some of the aspects of the processing logic may be implemented as a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Furthermore, it is understood that the processing logic 18 or relevant components thereof (such as an API component, agents, etc.) may also be automatically or semi-automatically deployed into a computer system by sending the components to a central server or a group of central servers. The components are then downloaded into a target computer that will execute the components. The components are then either detached to a directory or loaded into a directory that executes a program that detaches the components into a directory. Another alternative is to send the components directly to a directory on a client computer hard drive. When there are proxy servers, the process will select the proxy server code, determine on which computers to place the proxy servers' code, transmit the proxy server code, then install the proxy server code on the proxy computer. The components will be transmitted to the proxy server and then it will be stored on the proxy server.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A storage aware memory controller for in-memory data processing, comprising:
    a system for mapping physical memory space into a memory region and a storage region;
    a system for applying different error protections schemes, in which a fine-grained memory fault tolerance scheme is applied to data in the memory region and a course-grained memory fault tolerance scheme is applied to data in the storage region; and
    an in-memory storage filesystem that compresses and stores individual pages of data in the storage region, wherein each page of data is compressed into a set of codewords that are codeword aligned such that no codeword shares compressed data from different pages, and wherein the in-memory storage filesystem stores a compression-aware logical block address (CA-LBA) for each page of data.

2. The storage aware memory controller of claim 1, wherein the CA-LBA stores a virtual block ID, a compression flag, a head index that locates the codewords in a virtual block and a number of codewords.

3. The storage aware memory controller of claim 1, wherein each page comprises 4 kB of data.

4. The storage aware memory controller of claim 1, wherein the error protections schemes utilize error correction code (ECC) coding.

5. The storage aware memory controller of claim 1, wherein each page of data is compressed with a lossless compression engine.

6. The storage aware memory controller of claim 5, further comprising a lossless decompression engine.

7. The storage aware memory controller of claim 1, wherein the fine-grained memory fault tolerance scheme provides access patterns of 8-16 bytes, and the course-grained memory fault tolerance scheme provides access patterns of 128-4096 bytes.

8. A memory system comprising:
    a physical memory; and
    a storage aware memory controller for in-memory data processing, wherein the storage aware memory controller includes:
        a system for mapping the physical memory into a memory region and a storage region;
        a system for applying different error protections schemes, in which a fine-grained memory fault tolerance scheme is applied to data in the memory region and a course-grained memory fault tolerance scheme is applied to data in the storage region; and
        an in-memory storage filesystem that causes individual pages of data to be compressed and stored in the storage region, wherein each page of data is compressed into a set of codewords that are codeword aligned, and wherein the in-memory storage filesystem stores a compression-aware logical block address (CA-LBA) for each page of data.

9. The memory system of claim 8, wherein the CA-LBA stores a virtual block ID, a compression flag, a head index that locates the set of codewords in a virtual block and a number of codewords associated with the page of data.

10. The memory system of claim 8, wherein each page consists of 4 kB.

11. The memory system of claim 8, wherein the error protections schemes utilize error correction code (ECC) coding.

12. The memory system of claim 8, wherein each page of data is compressed with a lossless compression engine.

13. The memory system of claim 12, further comprising a lossless decompression engine.

14. The memory system of claim 8, wherein the fine-grained memory fault tolerance scheme provides access patterns of 8-16 bytes, and the course-grained memory fault tolerance scheme provides access patterns of 128-4096 bytes.

15. Computer programming logic stored in a computer readable storage medium, which when executed by a processing core, provides storage aware memory control for in-memory data processing, and comprises:
   program logic for mapping physical memory space into a memory region and a storage region;
   program logic for applying different error protections schemes, in which a fine-grained memory fault tolerance scheme is applied to data in the memory region and a course-grained memory fault tolerance scheme is applied to data in the storage region;
   program logic that compresses and stores individual pages of data in the storage region, wherein each page of data is compressed into a set of codewords that are codeword aligned such that no codeword shares compressed data from different pages; and
   program logic for maintaining a compression-aware logical block address (CA-LBA) for each page of data.

16. The computer programming logic of claim 15, wherein the CA-LBA stores a virtual block ID, a compression flag, a head index that locates the set of codewords in a virtual block and a number of codewords associated with the page of data.

17. The computer programming logic of claim 15, wherein each page consists of 4 kB.

18. The computer programming logic of claim 15, wherein the error protections schemes utilize error correction code (ECC) coding.

19. The computer programming logic of claim 15, wherein each page of data is compressed using lossless compression.

20. The computer programming logic of claim 19, further comprising programming logic for providing lossless decompression.

* * * * *